United States Patent
Park et al.

(10) Patent No.: US 6,169,026 B1
(45) Date of Patent: Jan. 2, 2001

(54) METHOD FOR PLANARIZATION OF SEMICONDUCTOR DEVICE INCLUDING PUMPING OUT DOPANTS FROM PLANARIZATION LAYER SEPARATELY FROM FLOWING SAID LAYER

(75) Inventors: In Ok Park; Yung Seok Chung; Eui Sik Kim, all of Ich'on (KR)

(73) Assignee: Hyundai Electronics Industries Co., Ltd., Kyoungki-do (KR)

( * ) Notice: Under 35 U.S.C. 154(b), the term of this patent shall be extended for 0 days.

(21) Appl. No.: 09/065,982

(22) Filed: Apr. 24, 1998

Related U.S. Application Data

(63) Continuation-in-part of application No. 08/752,904, filed on Nov. 20, 1996, now abandoned.

(30) Foreign Application Priority Data

Nov. 20, 1995 (KR) .................................. 95-42291

(51) Int. Cl.[7] ...................... H01L 21/4763; H01L 21/469
(52) U.S. Cl. .................... 438/632; 438/783; 438/784; 438/760; 438/909
(58) Field of Search .................................. 438/783, 784, 438/632, 760, 909

(56) References Cited

U.S. PATENT DOCUMENTS

| | | |
|---|---|---|
| 4,239,811 | 12/1980 | Kemlage . |
| 5,094,984 | 3/1992 | Liu et al. . |
| 5,169,801 | 12/1992 | Sato . |
| 5,268,333 | 12/1993 | Lee et al. . |
| 5,286,681 | 2/1994 | Maeda et al. . |
| 5,314,848 | 5/1994 | Yasui et al. . |
| 5,424,570 | 6/1995 | Sardella et al. . |
| 5,461,011 | 10/1995 | Hsue et al. . |

FOREIGN PATENT DOCUMENTS

| | | |
|---|---|---|
| 0519393 | 12/1992 | (EP) . |
| 63-170928 | 7/1988 | (JP) . |
| 1293632 | 11/1989 | (JP) . |
| 3-237744 | 10/1991 | (JP) . |
| 3273630 | 12/1991 | (JP) . |
| 4-69954 | 3/1992 | (JP) . |
| 6-29413 | 2/1994 | (JP) . |
| 6232280 | 8/1994 | (JP) . |
| 889427 | 9/1988 | (KR) . |
| 9115046 | 8/1991 | (KR) . |
| 93-11118 | 6/1993 | (KR) . |

OTHER PUBLICATIONS

English translation of Abstract for KR93–11118 (Jun. 23, 1993).

(List continued on next page.)

*Primary Examiner*—Richard Booth
*Assistant Examiner*—Ron Pompey

(57) ABSTRACT

The present invention discloses a method for planarizing a semiconductor device used in an integrated circuit. According to the method, a semiconductor substrate on which a patterned layer having topology is formed, is loaded into a reactor chamber. Afterwards, an interlevel insulating layer is formed on the semiconductor substrate. Thereafter, a layer for the planarization containing a dopant is formed on the interlevel insulating layer. The dopant contained in the layer for the planarization, is diffused outwards from the surface of the layer. The dopant diffused outwards from the layer for the planarization is pumped out to the outside of the reactor chamber without introducing an inert gas to the reactor chamber. Finally, the layer for the planarization is flowed.

12 Claims, 2 Drawing Sheets

OTHER PUBLICATIONS

Patents Abstracts of Japan, 4–69954, E–1221, Jun. 23, 1992 vol. 16, No. 280.

Patent Abstracts of Japan, 3–237744, E–1156, Jan. 20, 1992 vol. 16, No. 22.

English Translation of Purpose and Constitution of Korean Laid–Open No. 88–9427 (Sep.15, 1988).

English Translation of Purpose and Constitution of Korean Laid–Open No. 91–15046 (Aug.31, 1991).

"Silicon Nitride Isolation of Phosphosilicate Glass Layer," by D. Woo, J. DiPiazza & S. Policastro, Technical Notes, sheets 1–2, a Publication of RCA, 1979.

Silicon Processing for the VLSI Era, vol. 1: Process Technology, by S. Wolf, Ph.D. & R. Tauber, Ph.D., pp. 183–185, 189–190, Lattice Press, 1986.

METHOD FOR PLANARIZATION OF SEMICONDUCTOR DEVICE INCLUDING PUMPING OUT DOPANTS FROM PLANARIZATION LAYER SEPARATELY FROM FLOWING SAID LAYER

This application is a continuation-in-part of U.S. patent application Ser. No. 08/752,904, filed on Nov. 20, 1996, now abandoned entitled METHOD FOR PLANARIZATION OF SEMICONDUCTOR DEVICE. This application claims foreign priority under 35 U.S.C. §119 from Korean Patent Application No. 95-42291, filed Nov. 20, 1995.

BACKGROUND OF THE INVENTION

1. Field of the Invention

The present invention generally relates to a method for the planarization of a semiconductor device, and more particularly to a method capable of preventing dopants from precipitating during the flow process of a deposited layer for the planarization.

2. Description of the Related Art

In semiconductor devices, active devices such as transistors, passive devices such as resistors, and a multi-layer interconnection structure on the substrate are required. In the formation of the active device and passive device, the substrate surface can become uneven. Due to the high densification and high integration of the semiconductor device in recent years, the unevenness of the substrate surface has become conspicuous, and therefore more of a problem. It becomes more difficult to form a highly precise fine pattern. In addition, short-circuiting between the interconnections are also liable to occur. To solve these problems the technique for flattening the substrate surface is required.

Conventionally, a layer of insulating material such as silicon oxide is applied over such uneven surfaces, to permit the formation of a more finely patterned layer onto the surface of a non-planarized layer. This silicon dioxide layer, however, tends to conform to the underlying topography resulting in the creation of a non-planar or stepped surface. Accordingly, it is very difficult to form the more finely patterned layer on the uneven surface using a general lithography process.

Thus, there is provided a glass material such as spin-on-glass (SOG), and a material containing boron and/or phosphorous such as borosilicate glass (BPSG), phosphosilicate glass (PSG) and borosilicate glass (BSG) to be used for the formation of a planarized layer.

Among these layers for the planarization, for example a BPSG layer comprising boron of 3–5 wt % and phosphorous of 3–5 wt % is deposited on a semiconductor substrate having stepped layers thereon at a relatively low temperature of 400–450° C. Then, a thermal flow process for planarizing the BPSG layer deposited is performed at a temperature of 800–850° C., whereby a planarized surface is obtained. At this time, the BPSG layer acts as removing topology of the semiconductor substrate existing, for example, between a gate electrode and a first metal interconnection. As boron concentration (or weight fraction) in the BPSG layer increases, the flow temperature decreases. The degree of the planarization is also proportional to weight fraction of the boron and phosphorous atoms contained in the BPSG layer.

Referring to FIG. 1, a method for the planarization between a gate electrode and a first metal interconnection using BPSG layer according to the conventional art, is described.

A gate oxide film 3, a gate electrode 4, and junction regions are formed in and on a silicon substrate 1 (or wafer) with field oxide 2 for isolation of a device using a conventional method. Afterwards, sidewall spacers 6 are formed at both sides of the gate electrode 4 and then an interlevel insulating layer such as silicon dioxide is formed on the silicon substrate 1 by a chemical vapor deposition (CVD) method. Next, in order to even the overall surface topology due to height difference between the field oxide 2 and the gate electrode 4, a BPSG layer 8 is formed on the interlevel insulating layer 7 by either plasma enhanced chemical vapor deposition (PECVD) or atmospheric pressure chemical vapor deposition (APCVD). As described above, it is preferable that the concentration of boron and phosphorous contained in the BPSG layer 8 be 3.5–5 wt % to achieve a more planar surface.

The wafer 1 on which the BPSG layer 8 is formed, is loaded into a diffusion furnace maintaining atmospheric pressure and a temperature of 750 to 850° C. Afterwards, the temperature of the diffusion furnace is elevated to 800–850° C., and nitrogen ($N_2$) gas is supplied to the diffusion furnace. Under the above-mentioned conditions, a thermal annealing process for the flow of the deposited BPSG layer 8 deposited, proceeds for 20–60 minutes, whereby the BPSG layer 8 is planarized. Lastly, the temperature of the diffusion furnace is lowered to 650–800° C., and the wafer 1 is unloaded from the diffusion furnace.

Not shown in FIG. 1, a second insulating layer is then formed on the planarized BPSG layer 8 of the wafer 1, and specific portions of the second insulating layer, the BPSG layer, and the first insulating layer are etched to expose the underlying junction regions, thereby forming contact holes. Afterwards, metal interconnections are formed to electrically contact with the exposed junction regions.

Then, boron and phosphorous atoms doped in the BPSG layer 8 diffuse out to the surface thereof during the flow process because of the high flow temperature. The diffused boron and phosphorous atoms are gathered to the surface of the BPSG layer 8, whereby the surface thereof is oversaturated. Afterwards, when the wafer 1 is unloaded to the outside, the atoms gathered at the surface of the BPSG layer 8 are precipitated to crystal because of the abrupt change on the surface temperature and the moisture present in the atmosphere. These precipitated crystals generate not only crystal defects on the formation of a pattern but also pattern defects such as notching. Moreover, it degrades the insulating property of BPSG layer 8.

SUMMARY OF THE INVENTION

Accordingly, it is one object of the present invention to provide a method for the planarization of a semiconductor device capable of preventing the generation of crystal defects by preventing dopants contained in BPSG layer for the planarization from precipitating when a wafer which BPSG layer is formed thereon, is unloaded from a diffusion furnace after the flow process of the deposited BPSG layer has been completed.

Another object of this invention is to provide a method for the planarization of a semiconductor device capable of facilitating the patterning of a layer that is deposited on BPSG layer.

According to the present invention, a method for the planarization of a semiconductor device comprises the steps of: providing a semiconductor substrate on which a patterned layer having topology is formed, into a reactor chamber; forming an interlevel insulating layer on the semiconductor substrate; forming a layer for the planarization containing a dopant on the interlevel insulating layer; diffusing the dopant contained in the layer for the planarization, outwards from the surface of the layer; pumping out the dopant diffused outwards from the layer for the planarization to the outside of the reactor chamber without introducing an inert gas to the reactor chamber;and flowing the layer for the planarization.

BRIEF DESCRIPTION OF THE DRAWINGS

Further objects and advantages of the present invention will be apparent from the following description, reference being had to the accompanying drawings wherein preferred embodiment of the present invention are clearly shown.

In the drawings.

DETAILED DESCRIPTION OF THE INVENTION

Figure 1:
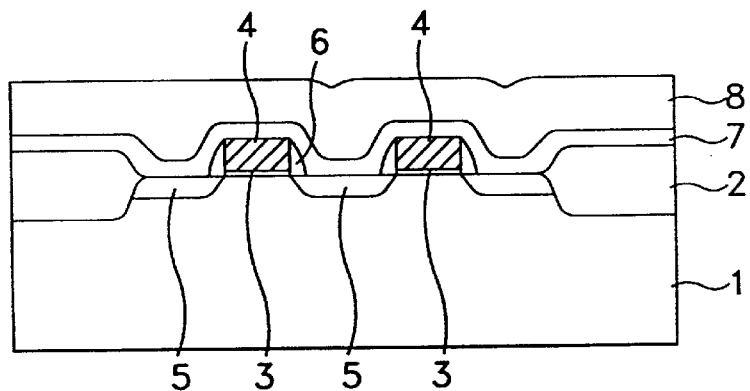
FIG. 1 is a cross-sectional view of a semiconductor device explaining a method for planarization of the semiconductor device according to the conventional art.
Figure 2A:
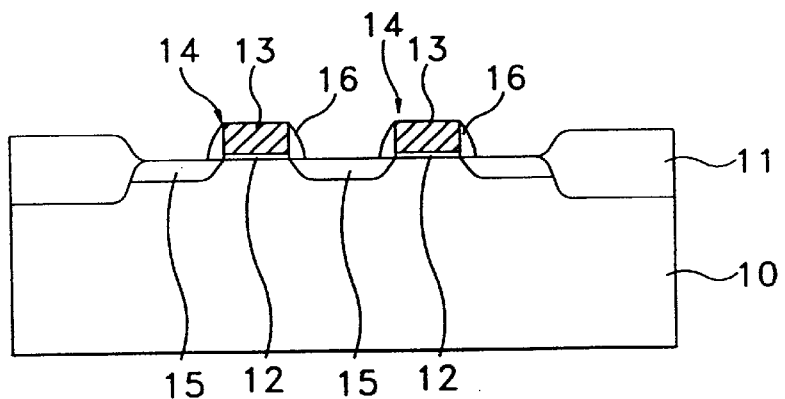
FIGS. 2A to 2E are cross-sectional views of a semiconductor device explaining a method for planarization of the semiconductor device to an embodiment of the present invention.

Referring to FIG. 2A, a field oxide 11 is formed by thermally growing specific portions of a silicon substrate (or wafer) 10. Afterwards, gate oxide 12 is deposited on the silicon substrate 10 to a thickness of 100–200 A, and a polysilicon layer 13 containing dopants is then deposited on the gate oxide 12 by a chemical vapor deposition. Next, a photomask pattern (not shown) is formed on the polysilicon layer 13 using a conventional photolithography method, and a gate electrode 14 is then formed by patterning the polysilicon layer 13 and the underlying gate oxide 12 using the photomask pattern. Impurity-doped regions 15 are formed at both sides of the gate electrode 14 in the wafer 10 using ion implantation method. Spacers 16 are provided on both side walls of the gate electrode 14 for the formation of a metal oxide semiconductor field effect transistor (MOSFET) having a lightly doped drain (LDD) structure, where the spacers 16 are formed by anisotropic etching of silicon dioxide layer deposited on MOSFET structure of FIG. 2A.

Figure 2B:
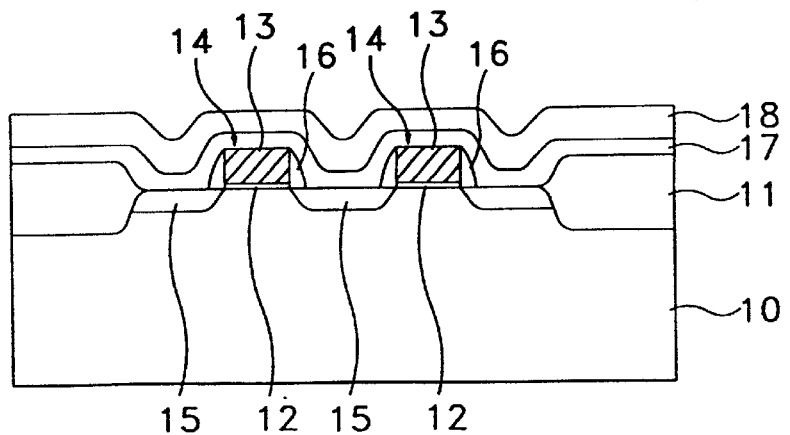

Referring to FIG. 2B, an insulating layer 17 such as silicon dioxide is formed on whole surface of the resultant structure of FIG. 2A using a chemical vapor deposition. Afterwards, an oxide layer containing dopants, for example, a BPSG layer 18 is deposited on the insulating layer 17 at a deposition condition of atmospheric pressure and a temperature range of 400–450° C. using APCVD method. It is possible to form the BPSG layer 18 using PECVD method. In this case, the BPSG layer 18 contains a high concentration of boron and phosphorous ions. Afterwards, the wafer 10 is loaded to a reactor chamber for low pressure chemical vapor deposition (LPCVD) whose inner pressure is maintained at 10–100 mTorr, and a first thermal annealing process is performed for approximately 60 minutes.

Figure 2C:
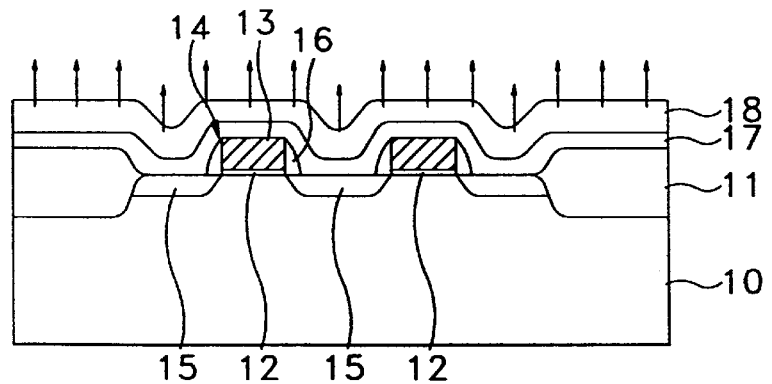
Figure 2D:
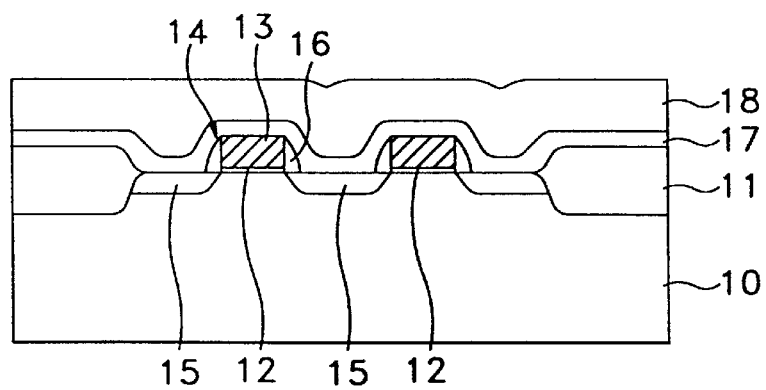

Referring to FIG. 2C, during the first thermal annealing, boron and phosphorous ions contained in the BPSG layer 18 are diffused outwards from the surface of the BPSG layer 18, and exist in the atmosphere of the reactor chamber. The first thermal annealing process is performed concurrently with a pumping process for pumping out the dopants diffused outwards from the BPSG layer 18 to the outside of the reactor chamber. During the first thermal annealing process and the pumping process, any atmospheric gas including nitrogen gas or inert gas such as argon is not supplied into the reactor chamber so as to prevent another defects from being created on the surface of the BPSG layer 18 by an atmospheric gas supplied being reacted with the outwardly diffused dopants. By the pumping process, diffused boron and phosphorous atoms are eliminated through an outlet from the reactor chamber to the outside of the chamber, thereby to decrease surface concentration of the BPSG layer 18. Afterwards, a second thermal annealing process is performed. During the second thermal annealing process, the temperature of the reactor chamber rises to 850–900° C., and nitrogen gas is supplied into the reactor chamber and the inside thereof is maintained at nitrogen atmosphere. Under the above-mentioned condition, the second thermal annealing process is performed for 20 to 40 minutes. As a result, the BPSG layer 18 is flowed as shown in FIG. 2D, resulting in the planarization of the surface of the wafer 10 without the precipitation of dopants taking place. After the second thermal annealing process is completed, the temperature of the reactor chamber lowers to 680–720° C., and then the wafer 10 is unloaded from the reactor chamber.

Meanwhile, so as to prevent the generation of crystal defects at the surface of the BPSG layer 18 due to abrupt change in the temperature of the reactor chamber, a passivation layer can be alternatively formed on the BPSG layer 18.

Figure 2E:
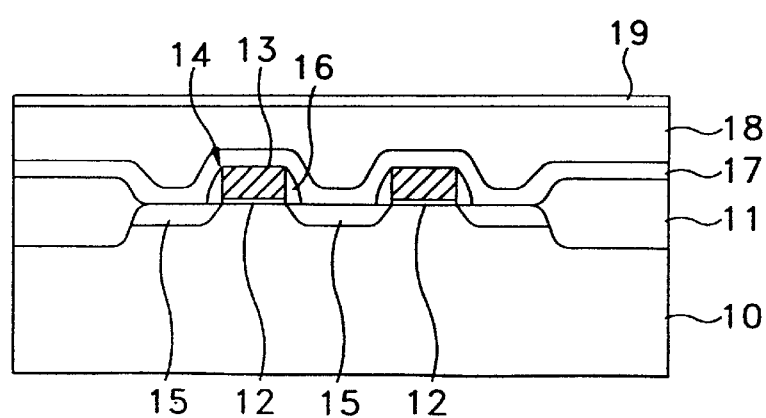

Referring to FIG. 2E, after the second thermal annealing process is completed, prior to the lowering the temperature to 680–720° C., a process for forming a passivation layer on BPSG layer 18 is performed. $N_2O$ gas is supplied to the reactor chamber, and the inside of the reactor chamber is at the same temperature range as that of the second thermal annealing. This passivation layer 19 prevents the generation of crystal defects because, although dopants precipitate on the surface of the BPSG layer 18 due to the abrupt temperature change, the layer 19 covers precipitates generated on the surface thereof.

After the formation of the passivation layer 19 is completed, the temperature of the reactor chamber for LPCVD is lowered to 680–720° C., and then the wafer 10 is unloaded from the reactor chamber.

Here, the first annealing process, the second annealing process and the passivation layer forming process are performed in the same reactor chamber without vacuum break.

As described in the above, the present invention facilitates the formation of a pattern that is formed during a process subsequent to a formation process of BPSG layer but also provides superior insulating property.

Other features, advantages and embodiments of the invention disclosed herein will be readily apparent to those exercising ordinary skill after reading the foregoing disclosures. In this regard, while specific embodiments of the invention have been described in considerable detail, variations and modifications of these embodiments can be effected without departing from the spirit and scope of the invention as described and claimed.

What is claimed is:

1. A method for the planarization of a semiconductor device comprising the steps of:

providing a semiconductor substrate on which a patterned layer having topology is formed, into a reactor chamber;

forming an interlevel insulating layer on the semiconductor substrate;

forming a layer for the planarization containing a dopant on the interlevel insulating layer;

diffusing the dopant contained in the layer for the planarization, outwards from the surface of the layer;

pumping out the dopant diffused outwards from the layer for the planarization to the outside of the reactor chamber without introducing an inert gas to the reactor chamber; and separately performing the step of flowing the layer for the planarization.

2. The method in accordance with claim 1, wherein said layer for the planarization is BPSG.

3. The method in accordance with claim 1, wherein diffusion of dopants is performed by a thermal annealing process.

4. The method in accordance with claim 1, wherein said diffusion step is performed for 50–70 minutes at a temperature of 650–750° C., and a pressure of 10–100 mTorr.

5. The method in accordance with claim 1, wherein said flowing step is performed for 25–35 minutes at a temperature of 850–900° C.

6. The method in accordance with claim 1, wherein both of said diffusing step and said flowing step are performed in the same chamber without vacuum break.

7. The method in accordance with claim 6, wherein both said steps are performed in LPCVD chamber.

8. The method in accordance with claim 1, further comprising the step of forming a passivation layer on the flowed layer for the planarization.

9. The method in accordance with claim 8, wherein said passivation layer is formed by a thermal oxidation process.

10. The method in accordance with claim 8, wherein said thermal oxidation process is performed at an atmosphere of $N_2O$.

11. The method in accordance with claim 8, wherein all of said diffusing step, said flowing step and said forming step of said passivation layer are performed in the same chamber without vacuum break.

12. The method in accordance with claim 8, wherein all said steps are performed in LPCVD chamber.

* * * * *